(12) United States Patent
Kim et al.

(10) Patent No.: US 10,355,195 B2
(45) Date of Patent: Jul. 16, 2019

(54) ACOUSTIC RESONATOR AND METHOD OF MANUFACTURING THE SAME

(71) Applicant: Samsung Electro-Mechanics Co., Ltd., Suwon-si (KR)

(72) Inventors: Dae Ho Kim, Suwon-si (KR); Dae Hun Jeong, Suwon-si (KR); Won Han, Suwon-si (KR); Sang Uk Son, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 298 days.

(21) Appl. No.: 15/381,397

(22) Filed: Dec. 16, 2016

(65) Prior Publication Data

US 2017/0338399 A1    Nov. 23, 2017

(30) Foreign Application Priority Data

May 18, 2016 (KR) ........................ 10-2016-0061047

(51) Int. Cl.
*H01L 41/053* (2006.01)
*H01L 41/047* (2006.01)
*H01L 41/27* (2013.01)
*H01L 41/297* (2013.01)
*H03H 9/17* (2006.01)

(52) U.S. Cl.
CPC ........ *H01L 41/053* (2013.01); *H01L 41/0471* (2013.01); *H01L 41/27* (2013.01); *H01L 41/297* (2013.01); *H03H 9/174* (2013.01)

(58) Field of Classification Search
CPC ... H01L 41/053; H01L 41/0471; H01L 41/27; H01L 41/297; H03H 9/174
See application file for complete search history.

(56) References Cited

U.S. PATENT DOCUMENTS

| 6,215,375 | B1 | 4/2001 | Larson, III et al. | |
| 6,396,200 | B2 | 5/2002 | Misu et al. | |
| 6,693,500 | B2 | 2/2004 | Yang et al. | |
| 6,812,619 | B1 | 11/2004 | Kaitila et al. | |
| 7,280,007 | B2 | 10/2007 | Feng et al. | |
| 2010/0013573 | A1* | 1/2010 | Umeda | H03H 9/0095 333/186 |
| 2010/0148636 | A1* | 6/2010 | Nishihara | H03H 9/02015 310/365 |
| 2013/0063227 | A1 | 3/2013 | Burak et al. | |
| 2014/0176261 | A1 | 6/2014 | Burak et al. | |
| 2015/0225231 | A1* | 8/2015 | Henn | H03H 9/02393 310/312 |
| 2017/0288121 | A1* | 10/2017 | Burak | H03H 9/02015 |

\* cited by examiner

*Primary Examiner* — Bryan P Gordon
(74) *Attorney, Agent, or Firm* — NSIP Law

(57) ABSTRACT

An acoustic resonator includes: a substrate; a resonance part including a lower electrode, a piezoelectric layer, and an upper electrode sequentially stacked on the substrate, and a frame formed on the upper electrode along an edge of the upper electrode; and a trench part formed in at least one side of the resonance part and making a thickness of the resonance part asymmetrical.

20 Claims, 9 Drawing Sheets

ACOUSTIC RESONATOR AND METHOD OF MANUFACTURING THE SAME

CROSS-REFERENCE TO RELATED APPLICATIONS

This application claims benefit under 35 USC 119(a) of Korean Patent Application No. 10-2016-0061047 filed on May 18, 2016 in the Korean Intellectual Property Office, the entire disclosure of which is incorporated herein by reference for all purposes.

BACKGROUND

1. Field

The flowing description relates to an acoustic resonator and a method of manufacturing an acoustic resonator.

2. Description of Related Art

In accordance with the trend towards miniaturization of wireless communications devices, the miniaturization of high frequency component technology has been demanded. An example of high frequency component technology is a bulk acoustic wave (BAW) resonator type filter using semiconductor thin film wafer manufacturing technology.

A bulk acoustic wave (BAW) resonator is a thin film type element configured to generate resonance using piezoelectric characteristics of a piezoelectric dielectric material deposited on a silicon wafer, which is a semiconductor substrate, and implemented as a filter.

A BAW resonator may be used in devices such as small, light filters, oscillators, resonance elements, and acoustic resonance mass sensors, of mobile communications devices, chemical sensing devices, and biological sensing devices.

Research has been conducted on various structural shapes and functions for improving the characteristics and performance of BAW resonators. Therefore, improved methods of manufacturing BAW resonators are desirable.

U.S. Pat. Nos. 6,396,200 and 7,280,007 disclose a mass loading structure of an outer side of an upper electrode of a resonator. The mass loading structure is a structure in which an energy trap is formed at an edge of a resonance part using a frame, and which serves to increase a quality factor of the resonator by keeping an acoustic wave formed in the resonator from being leaked to the outside of the resonator.

U.S. Pat. No. 6,812,619 discloses a resonator having a frame-like structure around a center area of the resonator. The frame-like structure forms a peripheral region with a slightly different cut-off frequency compared to that of a center area of the resonator that serves to reduce unwanted noise due to horizontal wave resonance by disturbing the formation of horizontal acoustic waves around a resonance frequency. However, the frame-like structure has a disadvantage in that a quality factor of the resonator at the resonance frequency is reduced due to an increase in an acoustic wave leaked outwardly of the resonator from a location adjacent to the frame.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic resonator includes: a substrate; a resonance part including a lower electrode, a piezoelectric layer, and an upper electrode sequentially stacked on the substrate, and a frame formed on the upper electrode along an edge of the upper electrode; and a trench part formed in at least one side of the resonance part and making a thickness of the resonance part asymmetrical.

The trench part may be formed in a shape of a groove in the upper electrode.

The upper electrode may be formed in a quadrangular shape, and the trench part may be disposed in parallel with sides of the upper electrode.

The trench part may be disposed continuously along two sides among the sides of the upper electrode.

A portion of the trench part disposed along one of the two sides and a portion of the trench part disposed along another of the two sides may have different widths.

The trench part may be formed as a linear groove along an inner wall of the frame.

A width of the trench part may be greater than a depth of the trench part.

The trench part may be formed at different depths depending on a position of the trench part.

The acoustic resonator may further include an insulation protecting layer stacked on the upper electrode, wherein the trench part is formed in a shape of a groove by a removed portion of the insulation protecting layer.

A bottom surface of the trench part may be formed by the insulation protecting layer.

The trench part may be formed in the lower electrode, and the piezoelectric layer may be filled in the trench part.

In another general aspect, a method to manufacture an acoustic resonator includes: forming a sacrificial layer on a substrate; sequentially stacking a lower electrode and a piezoelectric layer on the sacrificial layer; forming an upper electrode on the piezoelectric layer, wherein the upper electrode includes a trench part; and removing the sacrificial layer.

The forming of the upper electrode may include: forming a first electrode layer on the piezoelectric layer; and forming a second electrode layer on a region of an upper surface of the first electrode layer excluding the trench part.

The method may further include forming a frame layer on the second electrode layer.

The trench part may be disposed in the upper electrode only along two adjacent sides of the frame layer.

The forming of the upper electrode may include: forming an electrode layer on the piezoelectric layer; and forming the trench part by removing a portion of the electrode layer.

The method may further include forming a frame layer on the electrode layer.

Other features and aspects will be apparent from the following detailed description, the drawings, and the claims.

Figure 1:
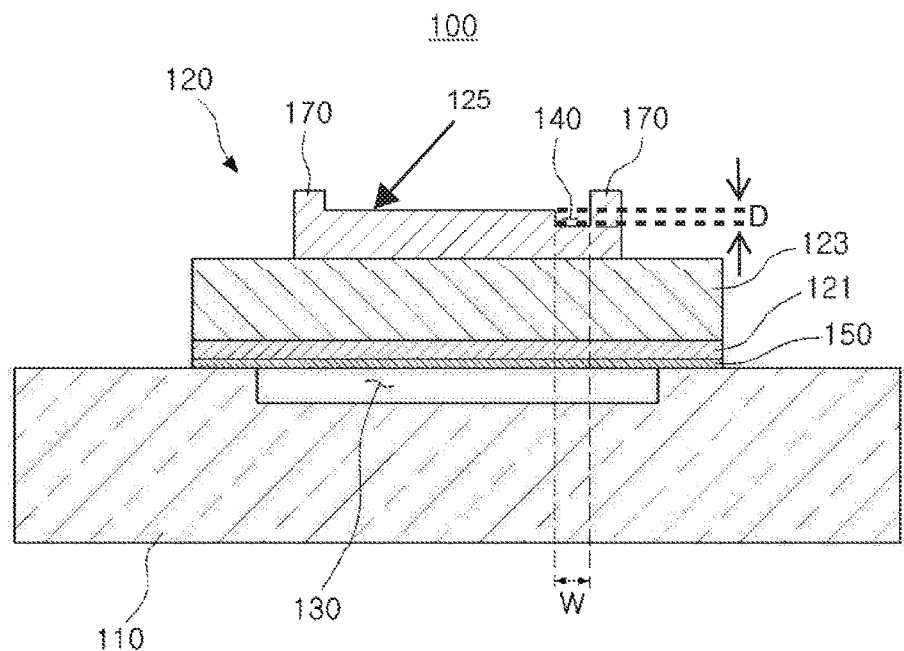
FIG. 1 is a cross-sectional view of an acoustic resonator, according to an embodiment.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
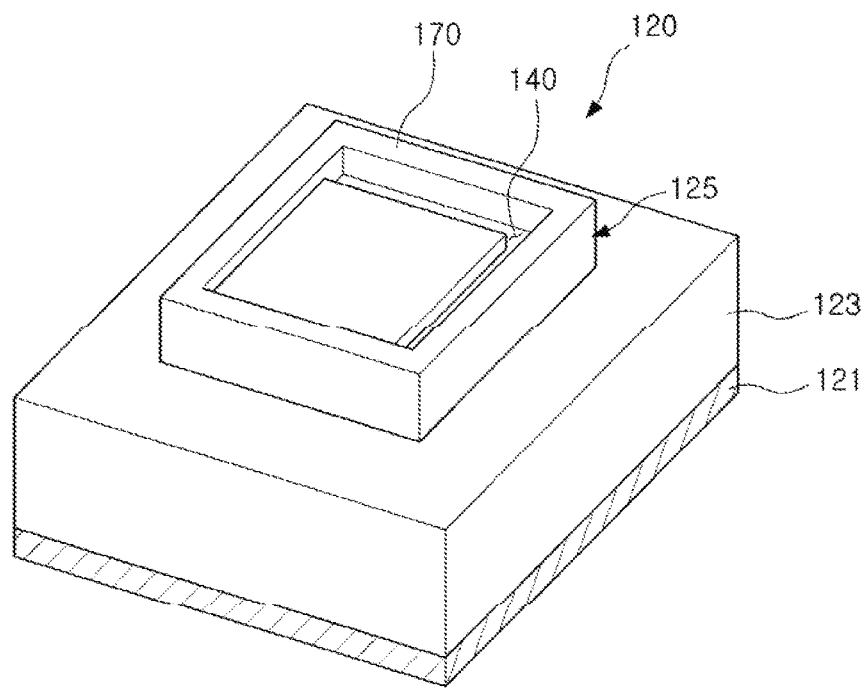
FIG. 2 is a schematic perspective view illustrating a resonance part of FIG. 1.
Figure 3:
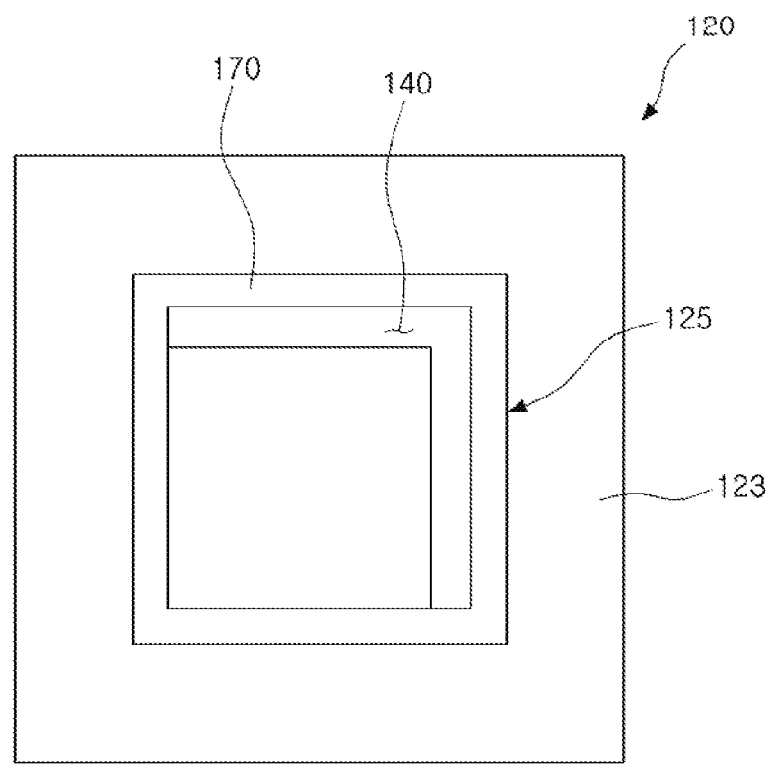
FIG. 3 is a plan view of FIG. 2.

FIG. 1 is a cross-sectional view of an acoustic resonator 100, according to an embodiment. FIG. 2 is a schematic perspective view illustrating a resonance part 120 of FIG. 1. FIG. 3 is a plan view of the resonance part 120.

Referring to FIGS. 1 and 2, an acoustic resonator 100 includes a substrate 110 and a resonance part 120. An air gap 130 is disposed between the substrate 110 and the resonance part 120. The resonance part 120 is formed on a membrane layer 150 and is spaced apart from the substrate 110 by the air gap 130.

The substrate 110 may be a silicon substrate or a silicon-on-insulator (SOI) type substrate. However, the substrate 110 is not limited to such examples, and may be any one of various types of substrate, such as a glass substrate.

The resonance part 120 includes a lower electrode 121, a piezoelectric layer 123, and an upper electrode 125. The resonance part 120 is formed, for example, by sequentially stacking the lower electrode 121, the piezoelectric layer 123, and the upper electrode 125 from the bottom. Therefore, the piezoelectric layer 123 is disposed between the lower electrode 121 and the upper electrode 125.

Since the resonance part 120 is formed on the membrane layer 150, the membrane layer 150, the lower electrode 121, the piezoelectric layer 123, and the upper electrode 125 are sequentially formed on the substrate 110.

The resonance part 120 resonates the piezoelectric layer 123, depending on signals applied to the lower electrode 121 and the upper electrode 125, to generate a resonance frequency and an anti-resonance frequency.

The lower electrode 121 and the upper electrode 125 may be formed using a metal such as gold (Au), molybdenum (Mo), ruthenium (Ru), aluminum (Al), platinum (Pt), titanium (Ti), tungsten (W), palladium (Pd), chromium (Cr), or nickel (Ni), as a main component. In the illustrated embodiment, the lower electrode 121 and the upper electrode 125 may be formed of molybdenum (Mo).

The resonance part 120 uses an acoustic wave of the piezoelectric layer 123. For example, when the signals are applied to the lower electrode 121 and the upper electrode 125, mechanical vibrations are generated in a thickness direction of the piezoelectric layer 123, such that an acoustic wave is generated.

Zinc oxide (ZnO), aluminum nitride (AlN), or quartz, may be used as a material of the piezoelectric layer 123.

A resonance phenomenon of the piezoelectric layer 123 is generated when a half of a wavelength of the applied signal coincides with a thickness of the piezoelectric layer 123. When the resonance phenomenon is generated, electrical impedance may rapidly change. Therefore, the acoustic resonator 100 may be used as a filter that selects a frequency.

The resonance part 120 is spaced apart from the substrate 110 through the air gap 130 in order to improve a quality (Q) factor of the acoustic resonator 100. For example, the air gap 130 is formed between the resonance part 120 and the substrate 110 to allow the acoustic waves generated in the piezoelectric layer 123 to not be affected by the substrate 110.

In addition, reflection characteristics of the acoustic wave generated in the resonance part 120 may be improved through the air gap 130. Since the air gap 130, which is an empty space, has an impedance close to infinity, the acoustic wave may remain in the resonance part 120 without being lost by the air gap 130.

In the illustrated embodiment, the air gap 130 is formed in a cavity shape on the substrate 110. However, the air gap 130 is not limited to such a shape, but may be formed to have any shape, as long as the resonance part 120 and the substrate 110 are spaced apart from each other.

As illustrated in FIGS. 1 to 3, a frame 170 is disposed on the upper electrode 125. The upper electrode 125 has a quadrangular shape in the illustrated embodiment. Therefore, the upper electrode 125 has four sides, and the frame 170 is disposed along the sides of the electrode 125. That is, the frame 170 is formed in a quadrangular ring shape along an edge of the upper electrode 125.

The acoustic resonator 100 is configured to reflect a horizontal elastic wave directed toward the outside of the resonance part 120 toward the inside of the resonance part 120 using the frame 170, thereby preventing energy loss of the elastic wave. In this case, since the reflected horizontal elastic wave reduces energy loss, the acoustic resonator 100 may have a high Q-factor and high $kt^2$.

The high Q-factor provides better signal passage in pass band and high rejection in out-of-band in implementing a filter or a duplexer, and the high $kt^2$ provides a bandwidth to increase a data rate and a transmission speed at a time of transmitting and receiving data.

The frame 170 may be formed of a piezoelectric material, a dielectric material, or a metal. For example, the frame 170 is formed of any one of aluminum nitride (AlN), lead zirconate titanate (PZT), silicon oxide ($SiO_2$), titanium oxide ($TiO_2$), ruthenium (Ru), molybdenum (Mo), gold (Au), titanium (Ti), copper (Cu), tungsten (W), and aluminum (Al), or a composite material including any one of aluminum nitride (AlN), lead zirconate titanate (PZT), silicon oxide ($SiO_2$), titanium oxide ($TiO_2$), ruthenium (Ru), molybdenum (Mo), gold (Au), titanium (Ti), copper (Cu), tungsten (W), and aluminum (Al) as a main component.

The frame 170 is formed, for example, by forming a frame layer on the upper electrode 125 through sputtering or deposition and then removing a required portion from the frame layer by an etching or lift-off process. The frame 170 may be formed of the same material as that of the upper electrode 125, and may be formed in a process of forming the upper electrode 125.

In addition, as shown in FIGS. 1 to 3, the acoustic resonator 100 includes a trench part 140 formed in the upper electrode 125. The trench part 140 is configured to suppress spurious, unnecessary vibrations.

The trench part 140 may be formed of a groove that reduces a thickness of the upper electrode 125 at the groove, and may be disposed along the edge of the upper electrode or adjacent to the edge of the upper electrode 125. In addition, the trench part 140 may be formed along any one of two surfaces adjacent to each other (e.g., intersecting surfaces) with respect to the four sides of the upper electrode 125 that are formed in the quadrangular shape. Therefore, the trench part 140 is not formed on each of the four sides of the upper electrode 125, but is only formed continuously on two sides of the upper electrode 125. As a result, the resonance part 120 is formed so that a thickness of the resonance part 120 is asymmetric, as illustrated in FIG. 1. For example, a plane of the trench part 140 is formed to have a ']' shape.

The trench part 140 may be formed as a groove sharing an inner wall of the frame 170. Therefore, the trench part 140 may be formed as a linear groove along the inner wall of the frame 170. Accordingly, the trench part 140 may be disposed in parallel with the corresponding sides of the upper electrode 125.

In addition, as shown in FIG. 1, a width W of the trench part 140 may be greater than a depth D of the trench part 140. For example, the trench part 140 has a depth D that is in a range of 2 to 20 nm and a width W that is in a range of 0.5 to 20 μm.

The acoustic resonator 100 configured as described above suppresses the spurious vibrations through the trench part 140 to significantly reduce the generation of noise. The spurious vibrations may be caused by a transverse mode standing wave (or a horizontal wave) generated in the resonance part 120, thereby distorting or deteriorating resonance performance. Therefore, in order to significantly reduce the spurious vibrations, the trench part 140 is asymmetrically formed in only a portion (for example, less than 50%) of a perimeter of the upper electrode 125 at an outer surface of the acoustic resonator 100, such that a structure of the upper electrode 125 is asymmetrical in a horizontal direction.

In addition, the trench part 140 is formed in the upper electrode 125 to reduce a thickness of the upper electrode 125 as compared to other portions of the upper electrode 125. Therefore, an amplitude in a vertical direction is more rapidly changed in the trench part 140, in which a thickness of the upper electrode 125 is relatively thin, as compared to other portions of the upper electrode 125, in which a thickness of the upper electrode 125 is thick.

As indicated above, amplitude change amounts in the vertical direction in a portion of the upper electrode 125 in which the trench part 140 is formed and in other portions of the upper electrode 125 are different from each other, and the portion of the upper electrode 125 in which the trench part 140 is formed and the other portions of the upper electrode 125 have different wave numbers in the transversal direction at a resonance frequency, such that overall vibration forms become different from each other. Therefore, the generation of resonance in the horizontal direction at a frequency lower than the resonance frequency is suppressed.

In addition, the frame 170 suppresses leakage of vibrations generated in the resonance part 120 to the outside of the resonance part 120, thereby increasing a quality (Q) factor of the acoustic resonator 100, and the trench part 140 suppresses resonance of horizontal vibrations. Therefore, the Q-factor and $kt^2$ of the acoustic resonator 100 are increased, and a horizontal wave noise blocking effect is obtained.

In addition, even though the resonance part 120 is formed in a rectangular shape, as opposed to a resonance part in the related art which is formed in an oval shape, a non-polygonal, or an atypical shape, horizontal wave noise is effectively suppressed in the acoustic resonator 100. Therefore, in a case in which a plurality of resonance parts 120 are disposed on the substrate 110, the resonance parts 120 may be efficiently arranged, and an interval between the resonance parts 120 may also be significantly reduced. Therefore, a size of an acoustic resonator including the resonance parts 120 may be significantly reduced, and a mounting area of the resonance parts 120 may be reduced.

Figure 4A:
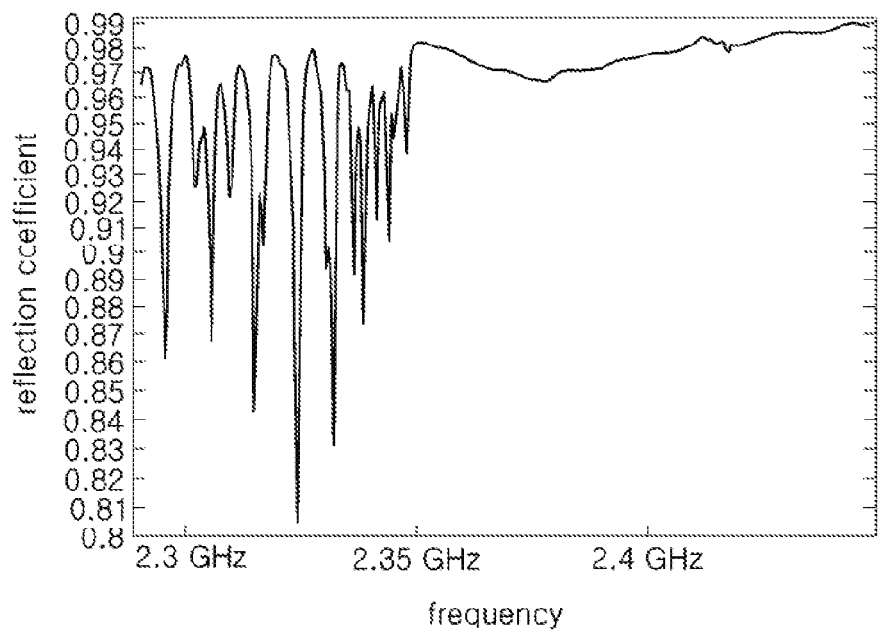
FIGS. 4A through 4C are graphs illustrating simulated values of an acoustic resonator according to an embodiment, and acoustic resonators according to related art.
Figure 4B:
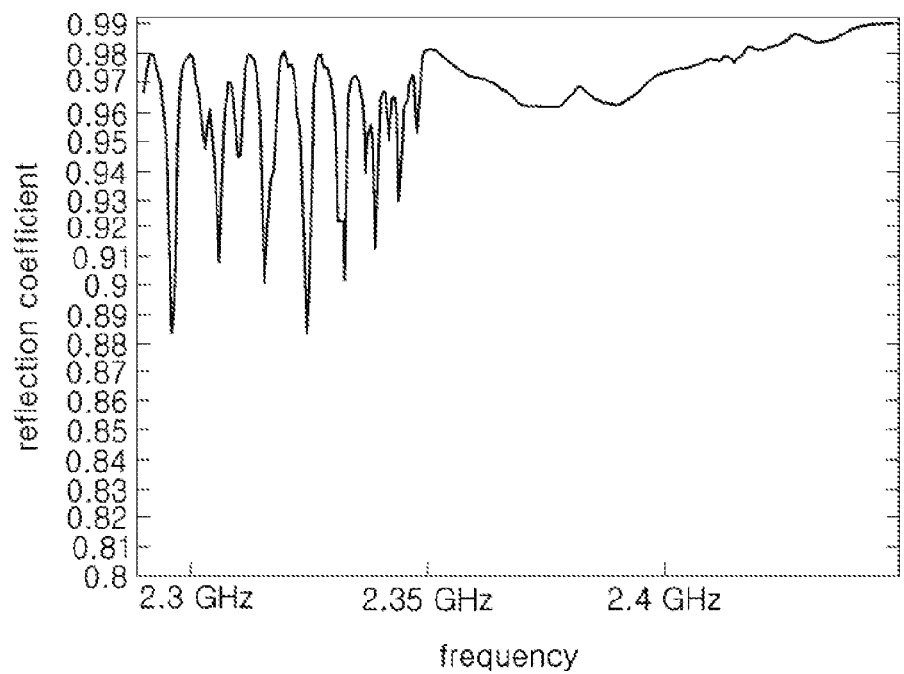
Figure 4C:
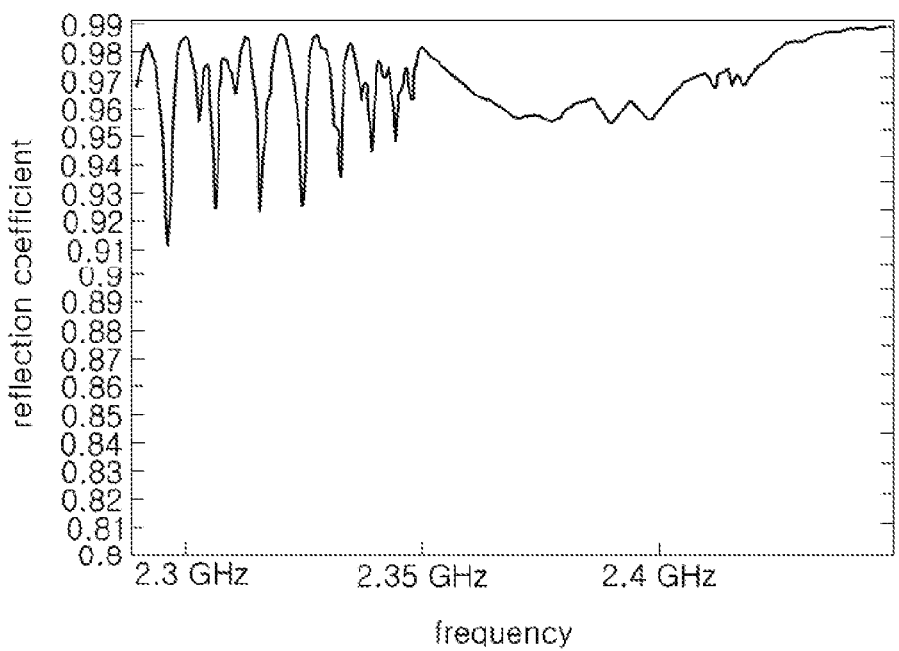

FIGS. 4A through 4C are graphs providing a comparison of simulated values of an acoustic resonator 100, according to an embodiment, and measurement values of acoustic resonators according to related art.

FIG. 4A illustrates electrical reflection characteristics of an acoustic resonator including only a frame 170 without including a trench part, and FIG. 4B illustrates electrical reflection characteristics of an acoustic resonator 100, according to an embodiment, including a frame 170 and a trench part 140. In addition, FIG. 4C illustrates electrical reflection characteristics of an acoustic resonator having a form in which a trench part is not formed only a portion of a perimeter of the upper electrode, but is formed in an entire circumference of the upper electrode in a ring shape. In other words, as opposed to the trench 140 of the embodiment disclosed herein, which surrounds a central area of the upper electrode 125 at only two adjacent sides of the upper electrode 125, the trench part of the resonator related to FIG. 4C entirely surrounds a central area of the upper electrode.

In the acoustic resonators used in simulations illustrated in FIGS. 4A through 4C, a lower electrode was formed of molybdenum (Mo) and was formed at a thickness of 190 nm, and a piezoelectric layer was formed of aluminum nitride (AlN) and was formed at a thickness of 900 nm. In addition, an upper electrode was formed of molybdenum (Mo) and was formed at a thickness of 300 nm, and a membrane layer formed of $SiO_2$ was formed at a thickness of 100 nm below the lower electrode.

In addition, a frame was formed at a width of 3 μm and a thickness of 300 nm, and was formed of molybdenum (Mo).

In each of the acoustic resonators corresponding to FIGS. 4A through 4C, noise due to horizontal wave resonance appears in a frequency band lower than 2.35 GHz in reflection characteristics of the acoustic resonators depending on a frequency.

It can be appreciated that the noise due to the horizontal wave resonance is significantly reduced in the acoustic resonator 100, according to the embodiment disclosed herein, representing the reflection characteristics of FIG. 4B as compared to the acoustic resonator representing the reflection characteristics of FIG. 4A.

It can also be appreciated that the noise due to the horizontal wave resonance in the acoustic resonator including the trench part in the shape of a ring, which is illustrated in FIG. 4C, is reduced in comparison to the noise due to the horizontal wave resonance in the acoustic resonator 100, which is illustrated in FIG. 4B.

Figure 13A:
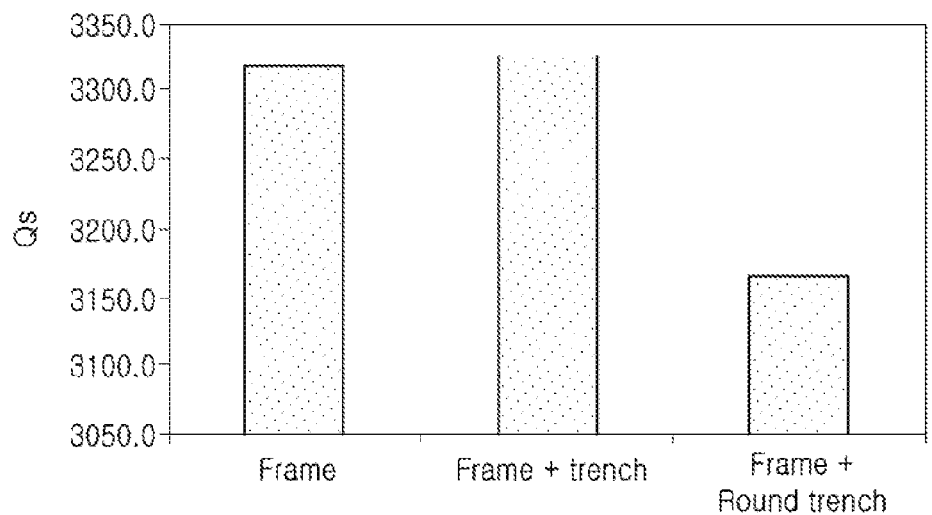
FIGS. 13A and 13B are graphs illustrating simulation results of quality factors of acoustic resonators representing reflection characteristics illustrated in FIGS. 4A through 4C.
Figure 13B:
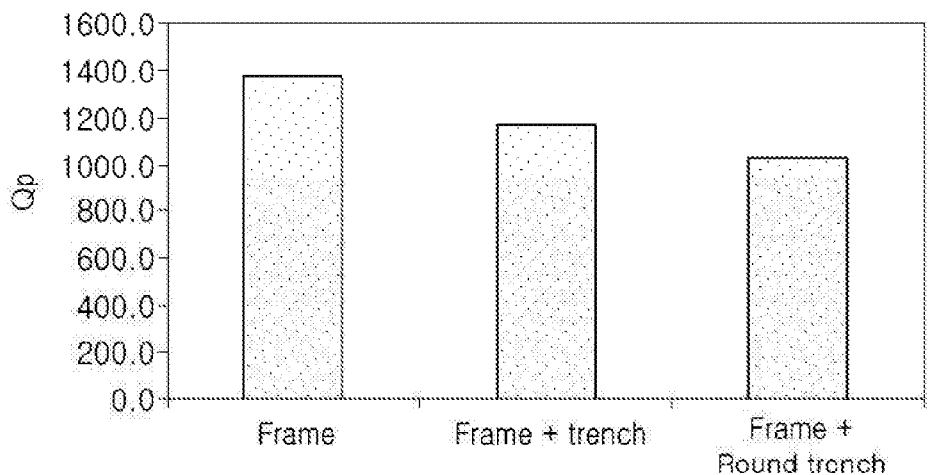

FIGS. 13A and 13B are graphs illustrating simulation results of quality factors of the acoustic resonators representing the reflection characteristics illustrated in FIGS. 4A through 4C. More specifically, FIG. 13A illustrates quality factors of the acoustic resonators at a resonance frequency, and FIG. 13B illustrates quality factors of the acoustic resonators at an anti-resonance frequency.

In addition, in FIGS. 13A and 13B, 'Frame' represents a quality factor of the acoustic resonator (corresponding to FIG. 4A) according to the related art including only a frame 170 without including a trench part, and 'Frame+trench' represents a quality factor of the acoustic resonator 100 (corresponding to FIG. 4B) according to the embodiment disclosed herein including both of a frame 170 and a trench part 140. In addition, 'Frame+Round trench' represents a quality factor of the acoustic resonator (corresponding to FIG. 4C) having a form in which a trench part surrounds an entire circumference of the upper electrode in a ring shape.

First, referring to FIG. 13A, a quality factor is significantly reduced in the acoustic resonator ('Frame+Round trench') including the trench part formed over the entire circumference of the upper electrode as compared to the acoustic resonator ('Frame') including only the frame.

On the other hand, a quality factor at a resonance frequency is slightly increased in the acoustic resonator 100, ('Frame+trench) according to the embodiment disclosed herein, including the trench part 140 as compared to the acoustic resonator ('Frame') including only the frame.

In addition, as seen from FIG. 13B, a quality factor at an anti-resonance frequency is significantly reduced in the acoustic resonator ('Frame+Round trench') including the trench part formed over the entire circumference of the upper electrode as compared to the acoustic resonator ('Frame')) including only the frame. On the other hand, a quality factor at an anti-resonance frequency is only slightly reduced in the acoustic resonator ('Frame+trench') 100 as compared to the acoustic resonator ('Frame')) including only the frame.

When the trench part 140 is asymmetrically formed in only a portion (for example, less than 50%) of the perimeter of the upper electrode 125 in which the frame is formed, as described above in the embodiment disclosed herein, deterioration of the quality factors at the resonance frequency and the anti-resonance frequency may be reduced as compared to the acoustic resonator ('Frame+Round trench) including the trench part formed over the entire circumference of the upper electrode, and the noise due to the horizontal wave resonance may be reduced to a level similar to that of the acoustic resonator ('Frame+Round trench) including the trench part formed over the entire circumference of the upper electrode.

Therefore, in the acoustic resonator 100, the noise due to the horizontal wave resonance is reduced in a state in which the quality factor at the resonance frequency is maintained, thereby improving resonance performance.

An acoustic resonator according to the disclosure herein is not limited to the abovementioned embodiment, but may be modified in various ways.

Acoustic resonators according to embodiments to be described below are similar to the acoustic resonator 100 according to the embodiment described above, with the exception of a structure of a trench part. Therefore, a description for components overlapping those described above will be omitted, and components different from those described above will primarily be described.

Figure 5:
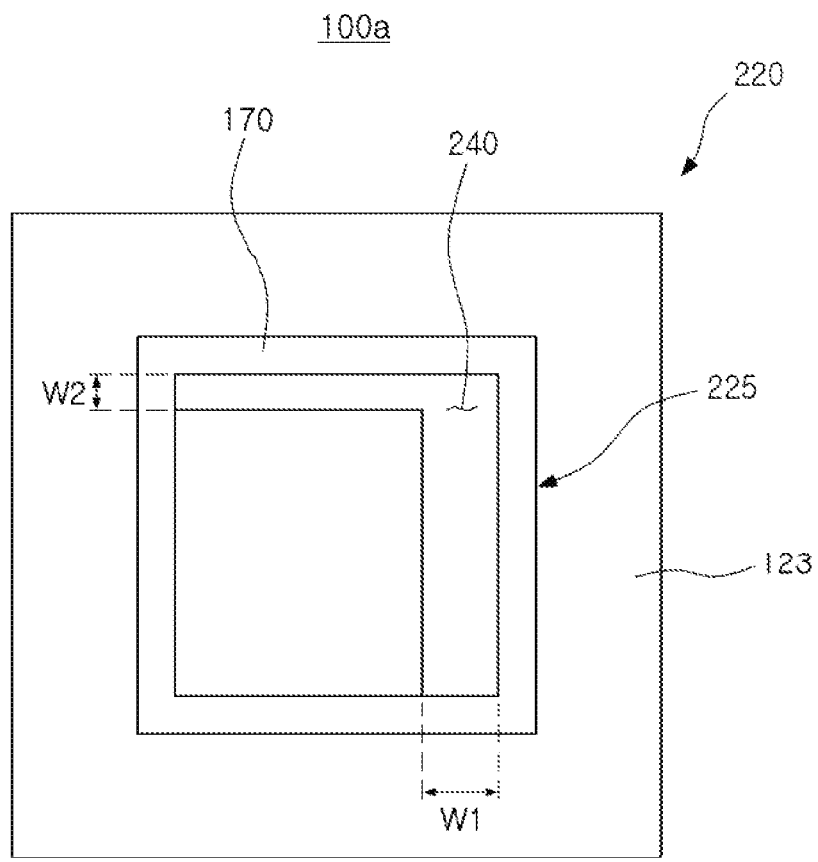
FIG. 5 is a schematic plan view illustrating a resonance part of an acoustic resonator, according to another embodiment.

FIG. 5 is a schematic plan view illustrating a resonance part 220 of an acoustic resonator 100*a*, according to another embodiment. In the acoustic resonator 100*a*, a trench part 240 includes portions having different widths. For example, a width W1 of the trench part 240 in one side of an upper electrode 225 and a width W2 of the trench part 240 formed in another side of the upper electrode 225, adjacent to the one side, are different from each other.

However, the trench part 240 is not limited to the described example, but may be modified in various ways. For example, the trench part 140 may be formed so that a width of the trench part 240 is gradually increased or decreased toward a corner of the upper electrode 240.

Figure 6:
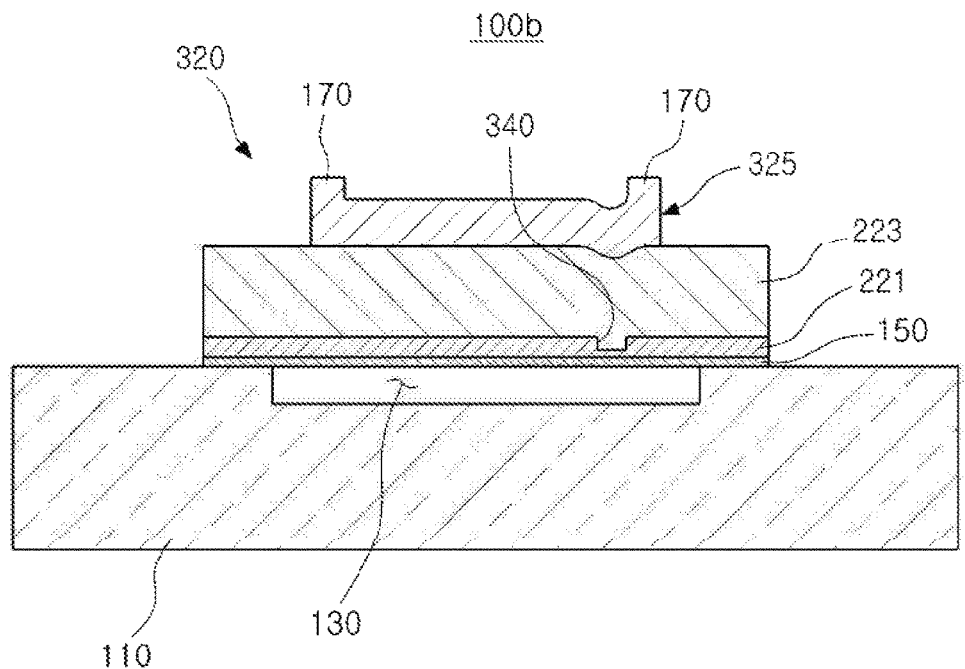
FIG. 6 is a schematic cross-sectional view illustrating an acoustic resonator, according to another embodiment.

FIG. 6 is a cross-sectional view schematically illustrating an acoustic resonator 100*b*, according to another embodiment. Referring to FIG. 6, in the acoustic resonator 100*b*, a trench part 340 is formed in a lower electrode 221 of a resonance part 320. In addition, a portion of a piezoelectric layer 223 stacked on the lower electrode 221 is filled in the trench part 340.

In addition, the portion of the piezoelectric layer 223 is filled in the trench part 340 of the lower electrode 221, such that a flexion is provided in the portion of the piezoelectric layer 123 filled in the trench part 340. This flexion also has an influence on an upper electrode 325. Therefore, flexion is also provided in a portion of the upper electrode 325 aligned with the trench part 340.

Figure 7:
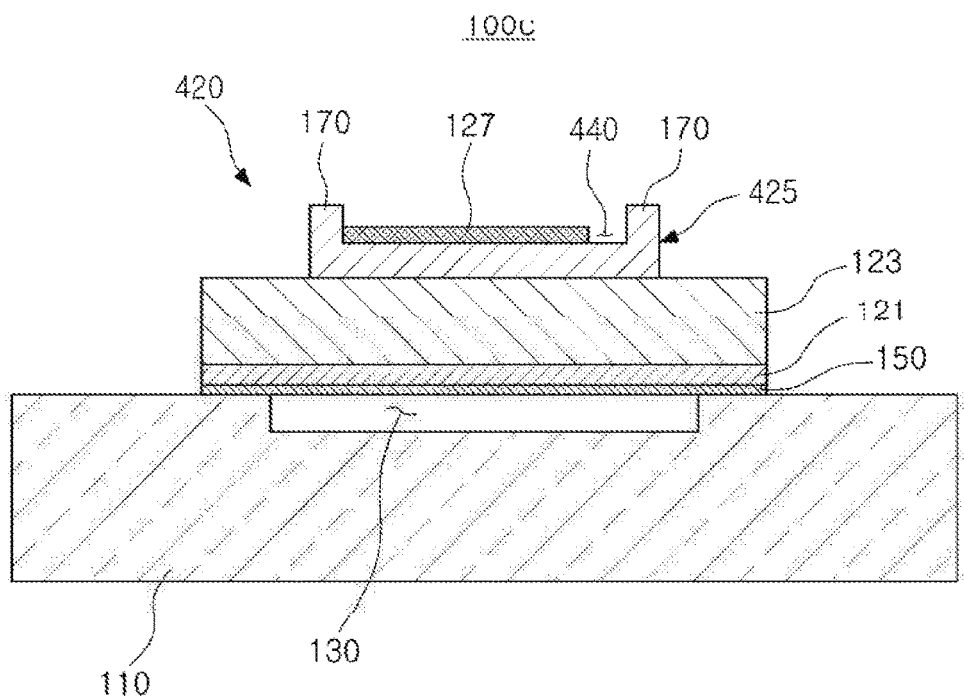
FIG. 7 is a schematic cross-sectional view illustrating an acoustic resonator, according to another embodiment.

FIG. 7 is a cross-sectional view schematically illustrating an acoustic resonator 100*c*, according to another embodiment. Referring to FIG. 7, an insulation protecting layer 127 is formed on an upper surface of an upper electrode 425 of a resonance part 420. In addition, a trench part 440 is formed of a groove formed by an area on the upper surface of the upper electrode 425 in which a portion of the insulation protecting layer is removed. A bottom surface of the trench part 440 is formed by an upper surface of the upper electrode 425.

However, a configuration of the acoustic resonator 100*c* is not limited to the illustrated example. That is, the trench part 440 may also be formed of a groove having a depth shallower than that of FIG. 7, such that the removed portion of the insulation protecting layer 127 forming the trench part 440 does not have a thickness equal to a thickness of the remaining portion of the insulating protecting layer. That is, the insulating protecting layer 127 is not completely removed in the area of the trench part 440, and the upper surface of the upper electrode 425 is not exposed. In this case, a bottom surface of the trench part 440 is formed by the insulation protecting layer 127.

As described above, the acoustic resonator according to the disclosure herein may be modified in various ways, as long as upper and lower and left and right shapes of the resonance part are asymmetrically formed. In addition, although not illustrated, the trench part may be formed at different depths depending on a position of the trench part.

A method of manufacturing the acoustic resonator 100 illustrated in FIG. 1 will be described.

FIGS. 8 through 11 are cross-sectional views illustrating the method of manufacturing the acoustic resonator 100 illustrated in FIG. 1, according to an embodiment.

Figure 8:
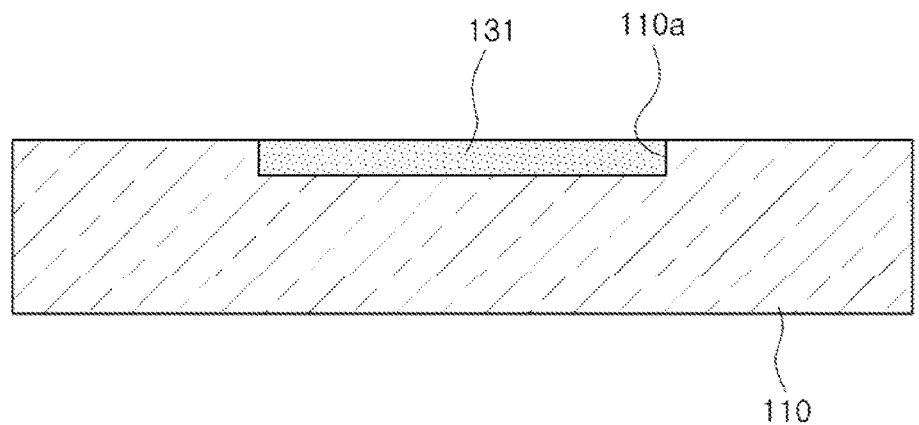
FIGS. 8 through 11 are cross-sectional views illustrating a method of manufacturing the acoustic resonator of FIG. 1, according to an embodiment.

First, referring to FIG. 8, a cavity 110*a* that will be used as the air gap 130 (see FIG. 1) is formed in an upper portion of the substrate 110. The substrate 110 may be a silicon substrate or a silicon-on-insulator (SOI) substrate. In addition, the cavity 110*a* may be formed through etching.

Next, a sacrificial layer 131 is formed in the cavity 110*a*. The sacrificial layer 131 is later removed to form the air gap 130 (see FIG. 1). The sacrificial layer 131 is formed, for example, of a material such as polysilicon or polymer.

Figure 9:
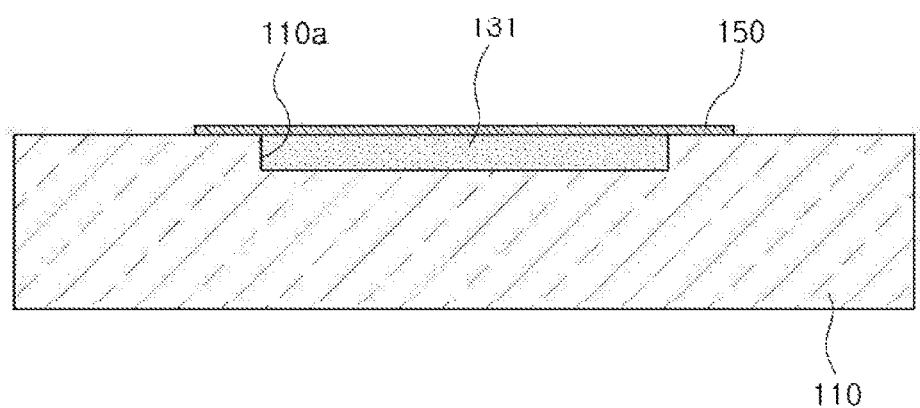

Then, as illustrated in FIG. 9, the membrane layer 150 is formed on the substrate 110 and the sacrificial layer 131. The membrane layer 150 serves to maintain a shape of the air gap 130 (see FIG. 1) and support a structure of the resonance part 120 (see FIG. 1).

Figure 10:
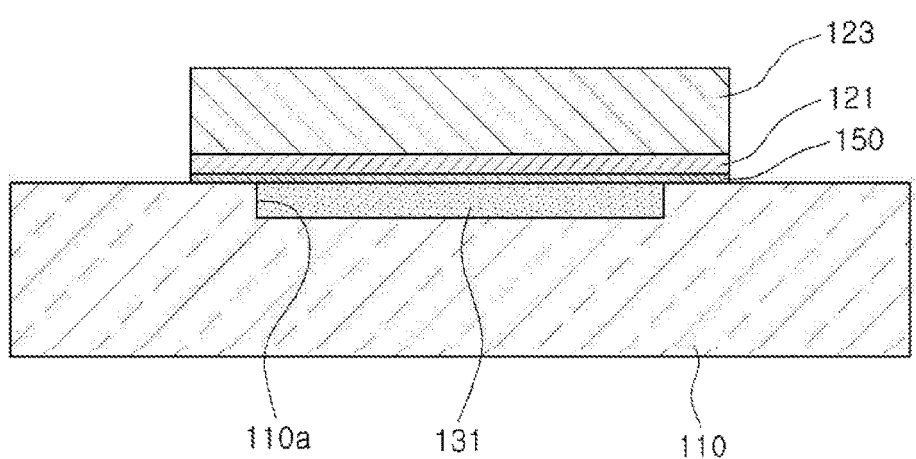

Then, as illustrated in FIG. 10, the lower electrode 121 and the piezoelectric layer 123 are sequentially formed on the membrane layer 150.

The lower electrode 121 is formed by depositing a conductive layer (not illustrated) on the substrate 110 and the sacrificial layer 131 and removing (for example, patterning) unnecessary portions. The process of forming the lower electrode 121 may be performed by photolithography, but is not limited thereto.

The conductive layer may be formed of molybdenum (Mo). However, a material of the conductive layer is not limited to Mo. That is, various metals such as gold (Au), ruthenium (Ru), aluminum (Al), platinum (Pt), titanium (Ti), tungsten (W), palladium (Pd), chromium (Cr), and nickel (Ni), may be used as a material of the conductive layer.

The piezoelectric layer 123 is formed by depositing a piezoelectric material on the lower electrode 121 and then performing patterning.

The piezoelectric layer 123 may be formed of aluminum nitride (AlN). However, a material of the piezoelectric layer 123 is not limited to AlN. That is, various piezoelectric materials such as zinc oxide (ZnO) and quartz may be used as a material of the piezoelectric layer 123.

Figure 11:
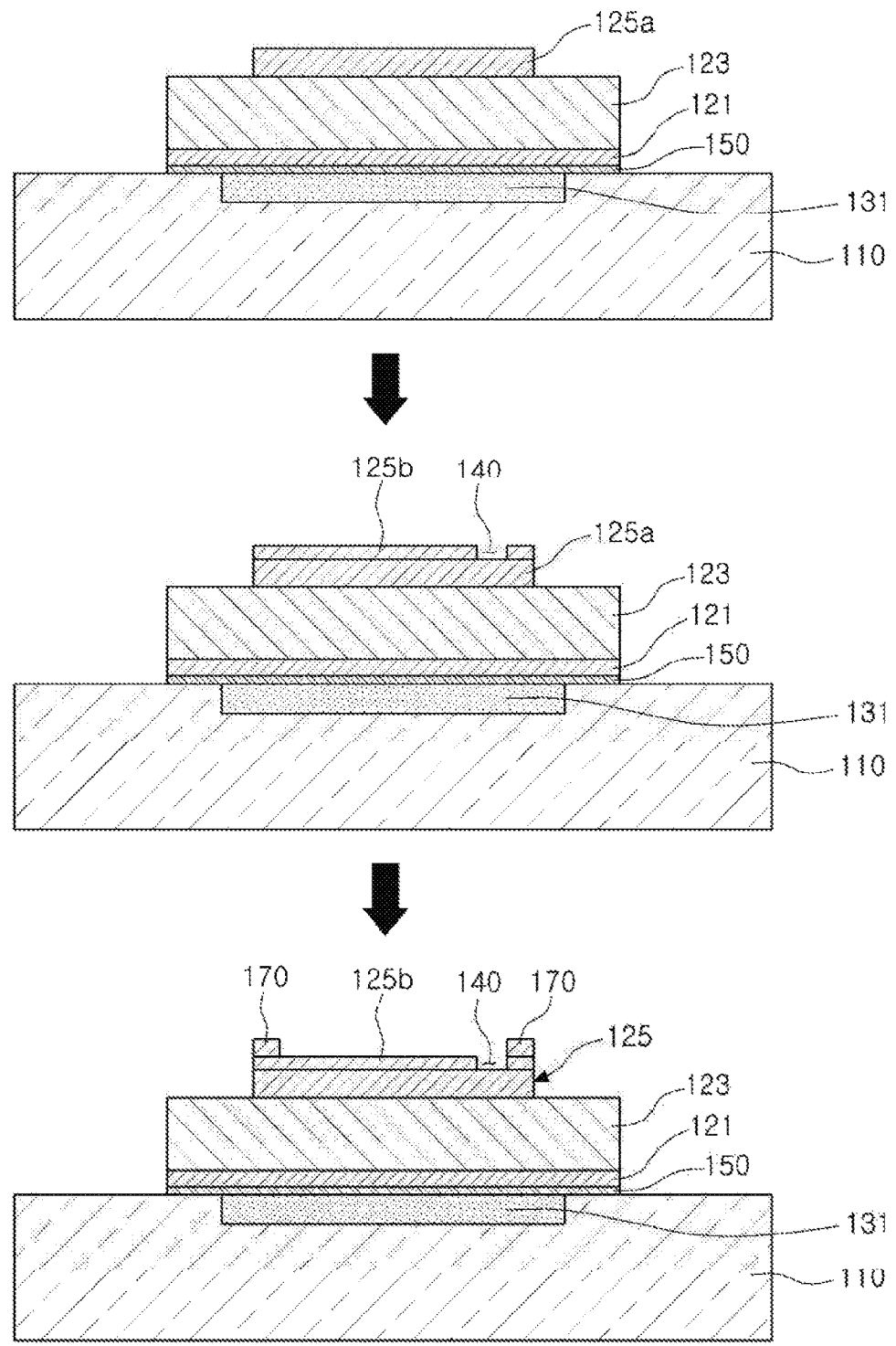

Then, as illustrated in FIG. 11, the upper electrode 125 is formed on the piezoelectric layer 123. To form the upper electrode 125, a first electrode layer 125*a* is formed on the piezoelectric layer 123. The first electrode layer 125*a* is formed by forming a conductive layer on the piezoelectric layer 123 and then performing patterning. Then, a second electrode layer 125*b* is formed on the first electrode layer 125*a*. In this case, the second electrode layer 125*b* is generally formed in a remaining region other than a region corresponding to the trench part 140. In addition, the second electrode layer 125*b* is formed at a thickness corresponding to a depth of the trench part 140. The second electrode layer 125*b* is formed such that a shape of the trench part 140 is completed.

In the embodiment illustrated in FIGS. 8 to 11, the first and second electrode layers 125*a* and 125*b* may be formed of molybdenum (Mo). However, materials of the first and second electrode layers 125*a* and 125*b* are not limited to Mo. That is, various metals such as gold (Au), molybdenum (Mo, aluminum (Al), platinum (Pt), titanium (Ti), tungsten (W), palladium (Pd), chromium (Cr), and nickel (Ni), may be used as materials of the first and second electrode layers 125*a* and 125*b*.

Then, the frame 170 is formed on the second electrode layer 125*b* along a perimeter of the second electrode layer 125*b*. The frame 170 may be formed by a photolithography process or a lift-off process, but is not limited to these processes.

The frame 170 may be formed of the same material as that of the second electrode layer 125b. However, the frame 170 is not limited to the material of the second electrode layer 125b.

Then, the sacrificial layer 131 is removed to complete the acoustic resonator 100. The sacrificial layer 131 may be removed by an etching method.

A method of manufacturing the acoustic resonator 100 is not limited to the abovementioned embodiment, but may be modified in various ways.

Figure 12:
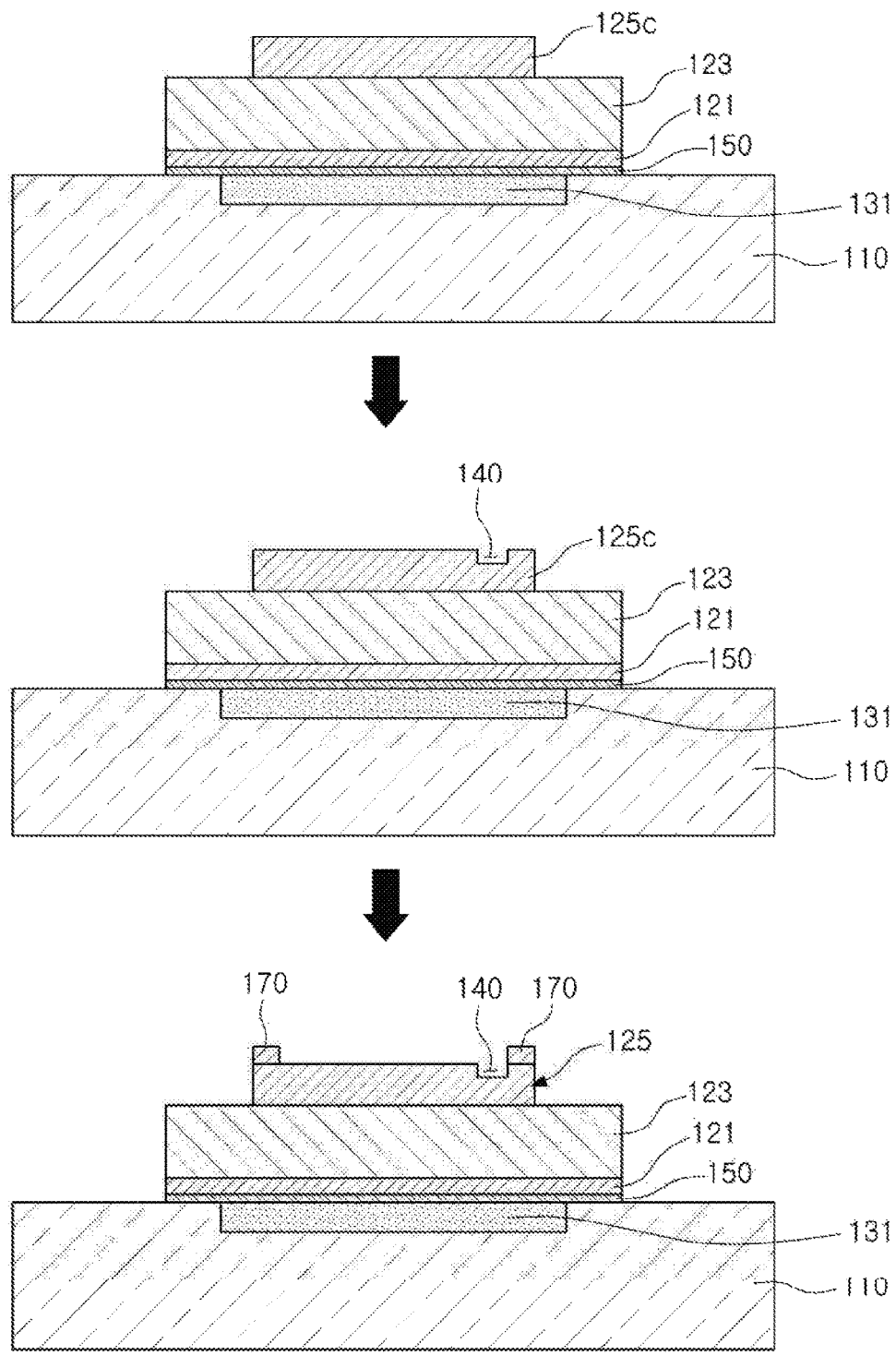
FIG. 12 is a cross-sectional view illustrating a method of manufacturing the acoustic resonator of FIG. 1, according to another embodiment.

FIG. 12 is a cross-sectional view illustrating a method of manufacturing the acoustic resonator 100, according to another embodiment. In the method of FIG. 12, processes up to the process illustrated in FIG. 10 are performed in the same manner as those of the method of the previous embodiment.

When the piezoelectric layer 123 is formed as illustrated in FIG. 10, an electrode layer 125c is formed, as illustrated in FIG. 12. The electrode layer 125c is formed at the same thickness as an overall thickness of the first and second electrode layers 125a and 125b (see FIG. 11) according to the previous embodiment.

Then, the trench part 140 is formed in the electrode layer 125c. The trench part 140 is formed by removing a portion of the electrode layer 125c. For example, the trench part 140 is formed by an etching method.

Then, the frame 170 is formed along a perimeter of the electrode layer 125c, and the sacrificial layer 131 is removed to complete the acoustic resonator 100.

As set forth above, in the embodiments of an acoustic resonator and a method of manufacturing an acoustic resonator disclosed herein, the resonance part may be formed in various shapes including a quadrangular shape. Therefore, in a case in which a plurality of resonance parts are disposed on the substrate, the resonance parts may be efficiently arranged, and an interval between the resonance parts may also be significantly reduced.

In addition, a trench structure in the disclosed embodiments suppresses the generation of noise due to horizontal wave resonance by adjusting only a boundary of one side of the resonator in a change of an amplitude in a vertical direction of a cross section of the resonator depending on a horizontal position. The trench structure formed as described above avoids a decrease in a quality factor, which is a disadvantage of a frame structure according to related art, and suppresses noise due to the horizontal wave resonance, which is an advantage of the frame structure according to related art.

Although the trench part and the frame are formed on the upper electrode in some of the disclosed embodiments, the upper electrode may include only the trench part without including the frame. In this case, the trench part may be formed in the same position as that according the above-described embodiments, but is not limited to such a position. That is, the trench part may be formed of a groove formed at a position at which the frame is disposed and having an externally open side surface.

In addition, various other modifications may be made to the disclosed embodiments. For example, the trench part may be disposed at the outermost portion of the upper electrode, and the frame may be disposed inside the trench part.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator comprising:
a substrate;
a resonance part comprising
a lower electrode, a piezoelectric layer, and an upper electrode sequentially stacked on the substrate, and
a frame formed on the upper electrode along an edge of the upper electrode; and
a trench part formed in the resonance part, along only two sides of the upper electrode, and forming a thickness of the resonance part to be asymmetrical.

2. The acoustic resonator of claim 1, wherein the trench part is formed in a shape of a groove in the upper electrode.

3. The acoustic resonator of claim 2, wherein:
the upper electrode is formed in a quadrangular shape, and
the trench part is disposed parallel to the two sides of the upper electrode.

4. The acoustic resonator of claim 3, wherein the trench part is disposed continuously along the two sides of the upper electrode.

5. The acoustic resonator of claim 4, wherein a portion of the trench part disposed along one of the two sides and a portion of the trench part disposed along another of the two sides have different widths.

6. The acoustic resonator of claim 1, wherein the trench part is formed as a linear groove along an inner wall of the frame.

7. The acoustic resonator of claim 1, wherein a width of the trench part is greater than a depth of the trench part.

8. The acoustic resonator of claim 1, wherein the trench part is formed at different depths depending on a position of the trench part.

9. The acoustic resonator of claim 1, further comprising an insulation protecting layer stacked on the upper electrode, wherein the trench part is formed in a shape of a groove by a removed portion of the insulation protecting layer.

10. The acoustic resonator of claim 9, wherein a bottom surface of the trench part is formed by the insulation protecting layer.

11. The acoustic resonator of claim 1, further comprising a second trench part formed in the lower electrode, wherein the piezoelectric layer is filled in the second trench part.

12. A method to manufacture an acoustic resonator, comprising:
forming a sacrificial layer on a substrate;
sequentially stacking a lower electrode and a piezoelectric layer on the sacrificial layer;
forming an upper electrode on the piezoelectric layer, wherein the upper electrode comprises a trench part disposed along only two sides of the upper electrode; and
removing the sacrificial layer.

13. The method of claim 12, wherein the forming of the upper electrode comprises:
forming a first electrode layer on the piezoelectric layer; and
forming a second electrode layer on a region of an upper surface of the first electrode layer excluding the trench part.

14. The method of claim 13, further comprising forming a frame layer on the second electrode layer.

15. The method of claim 14, wherein the trench part is disposed in the upper electrode along only two adjacent sides of the frame layer.

16. The method of claim 12, wherein the forming of the upper electrode comprises:
forming an electrode layer on the piezoelectric layer; and
forming the trench part by removing a portion of the electrode layer.

17. The method of claim 16, further comprising forming a frame layer on the electrode layer.

18. The acoustic resonator of claim 1, wherein the two sides are adjacent to each other.

19. The acoustic resonator of claim 1, wherein the trench part is formed along less than 50% of a perimeter of the upper electrode.

20. An acoustic resonator comprising:
a substrate;
a resonance part comprising
a lower electrode, a piezoelectric layer, and an upper electrode sequentially stacked on the substrate, and
a frame formed on the upper electrode along an edge of the upper electrode; and
a trench part formed in the resonance part, along sides of the upper electrode, and forming a thickness of the resonance part to be asymmetrical,
wherein a portion of the trench part disposed along one of the sides and a portion of the trench part disposed along another of the sides have different widths.

* * * * *